(12) United States Patent
Kim

(10) Patent No.: US 7,169,678 B2
(45) Date of Patent: Jan. 30, 2007

(54) METHOD OF FORMING A SEMICONDUCTOR DEVICE USING A SILICIDE ETCHING MASK

(75) Inventor: Seok Su Kim, Gyeonggi-do (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 0 days.

(21) Appl. No.: 10/950,017

(22) Filed: Sep. 24, 2004

(65) Prior Publication Data
US 2005/0064691 A1  Mar. 24, 2005

(30) Foreign Application Priority Data
Sep. 24, 2003  (KR) .................. 10-2003-0066135

(51) Int. Cl.
*H01L 21/336* (2006.01)

(52) U.S. Cl. .............. 438/303; 438/299; 438/304; 438/581; 438/596

(58) Field of Classification Search .............. None
See application file for complete search history.

(56) References Cited

U.S. PATENT DOCUMENTS

| | | | |
|---|---|---|---|
| 6,239,007 B1 * | 5/2001 | Wu | 438/585 |
| 6,326,290 B1 * | 12/2001 | Chiu | 438/592 |
| 6,383,882 B1 | 5/2002 | Lee et al. | |
| 6,534,405 B1 | 3/2003 | Wu | |
| 6,864,178 B1 * | 3/2005 | Kim | 438/692 |

* cited by examiner

*Primary Examiner*—Zandra V. Smith
*Assistant Examiner*—Khanh Duong
(74) *Attorney, Agent, or Firm*—Saliwanchik Lloyd & Saliwanchik

(57) ABSTRACT

Semiconductor devices and methods for fabricating a silicide of a semiconductor device are disclosed. An illustrated method comprises: forming a gate electrode; depositing an insulating layer; removing a predetermined portion of the insulating layer in order to expose a portion of the gate electrode; forming silicide on the exposed portion of the gate electrode; and etching the insulating layer while using the silicide as an etching mask.

9 Claims, 5 Drawing Sheets

METHOD OF FORMING A SEMICONDUCTOR DEVICE USING A SILICIDE ETCHING MASK

FIELD OF THE DISCLOSURE

The present disclosure relates generally to semiconductor fabrication and, more particularly, to semiconductor devices and methods for fabricating a silicide of a semiconductor device.

BACKGROUND

As semiconductor devices become more integrated, the size of the gate electrode and active region decreases and sheet resistivity increases. Consequently, the performance of the semiconductor devices incorporating these structures becomes increasingly deteriorated. Although a silicide is typically formed on the gate electrode and active region, the diminution of the gate electrode and active region prevents the formation of a stable silicide.

One of the methods to solve the above-mentioned problems is to enlarge the surface area of the gate electrode by over-etching spacers during an etching process.

FIG. 1a through FIG. 1f are cross-sectional views illustrating a conventional method of fabricating a gate electrode. Referring to FIG. 1a, a gate oxide layer (not shown) and a gate electrode 101 are formed on a semiconductor substrate 100. A first insulating layer is deposited on the substrate 100 and on the gate electrode 101. A second insulating layer is then deposited on the first insulating layer. First spacers 102 and second spacers 103 are formed on the sidewalls of the gate electrode 101 by etching the entire area of the substrate without an etching mask.

Referring to FIG. 1b, the end portion of the first and second spacers 102, 103 may be partially exposed by over-etching the entire area of the substrate without an etching mask to fabricate more stable silicide in preparation for later processes. A cleaning process is then performed to remove a residual oxide layer 104 on the active region and the gate electrode. In addition, the residual oxides 104 on the first and second spacers 102, 103 are also removed. As a result, metallic materials deposited on the gate electrode 101 and the substrate 100 will readily react with the gate electrode and the substrate 100 during a later silicide formation process.

Referring to FIG. 1c, during the cleaning process, the first spacers 102 are etched deeper than the second spacers 103 and the gate electrode 101 so that voids A are formed between the second spacers 103 and the gate electrode 101.

Referring to FIG. 1d, highly concentrated N or P type impurity ions are implanted into the entire area of the resulting substrate 100 in order to form a source and a drain junction 105.

Referring to FIG. 1e, Ti 106 is deposited on the resulting substrate for silicide.

Referring to FIG. 1f, an annealing process is then performed to cause a reaction between the Silicide layer and the structure including the gate electrode 101 and the source/drain junction 105. A Ti silicide layer 108 is then formed on the gate electrode 101, but not on the first and second spacers 102, 103. A cleaning process to remove the unreacted Ti is then performed to complete the illustrated prior art silicide formation process.

Wu, U.S. Pat. No. 6,534,405, describes a method for fabricating a MOSFET device using a dual salicide formation procedure.

Lee et al., U.S. Pat. No. 6,383,882, describes a method for fabricating a MOS transistor using a selective silicide process wherein a gate insulating layer and a gate poly-silicon layer are sequentially formed on a silicon substrate, and a gate spacer is formed on a side wall of the gate insulating layer and the gate poly-silicon layer.

However, the above-mentioned prior art methods for fabricating a silicide of a semiconductor device have the following problems.

First, during the cleaning process of the residual oxide layer 104 on top of the active region and the gate electrode 101, the first spacers 102 are etched deeper than the second spacers 103 and the gate electrode 101. Voids A are then formed between the second spacer 103 and the gate electrode 101. The voids A can decrease the reliability of the semiconductor device.

Second, the gate oxide layer in the active region may be simultaneously removed during over-etching. Thus, the desired thickness of the oxide layer cannot be obtained.

DETAILED DESCRIPTION

FIG. 2a through FIG. 2d are cross-sectional views illustrating an example process for fabricating a silicide of a semiconductor device performed in accordance with the teachings of the present invention.

Figure 1A:
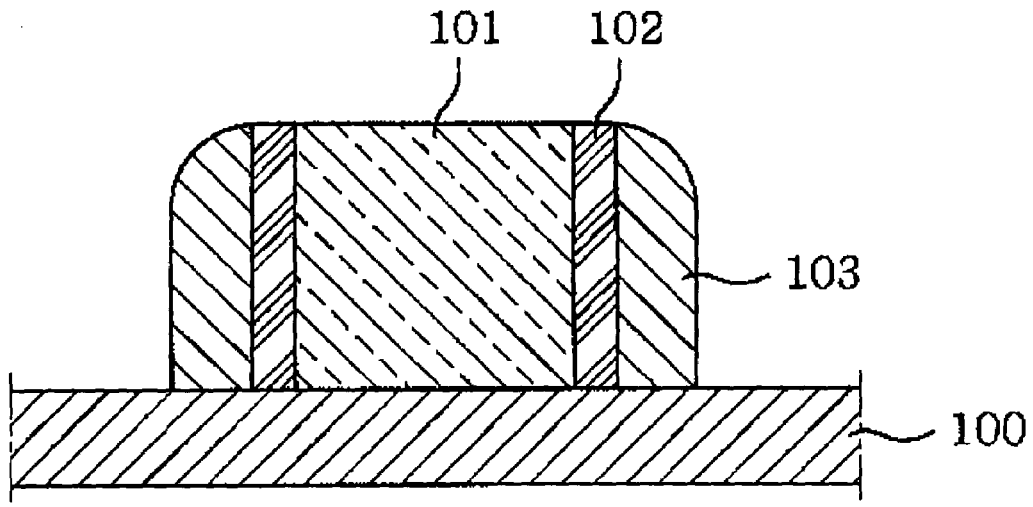
FIG. 1a through FIG. 1f are cross-sectional views illustrating a prior art method for fabricating a silicide of a semiconductor device.
Figure 1B:
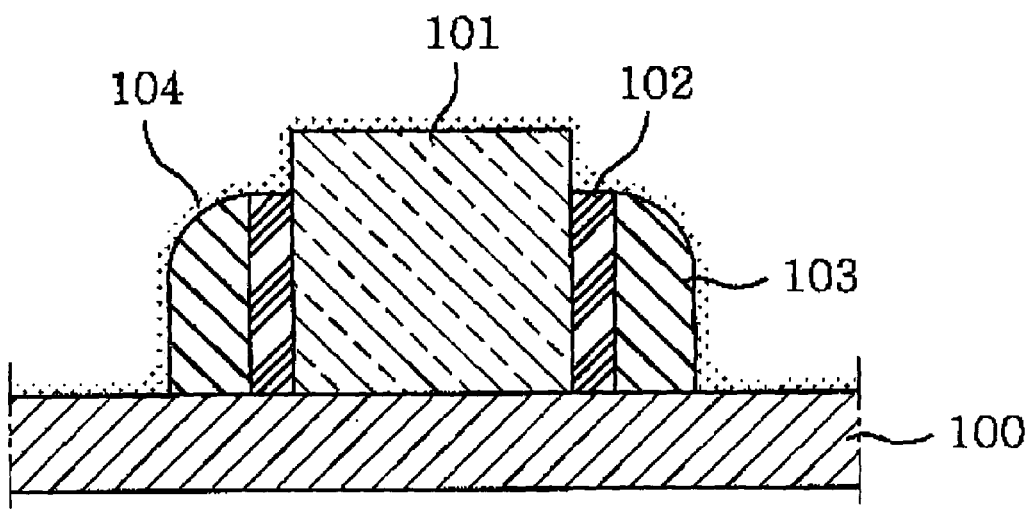
Figure 1C:
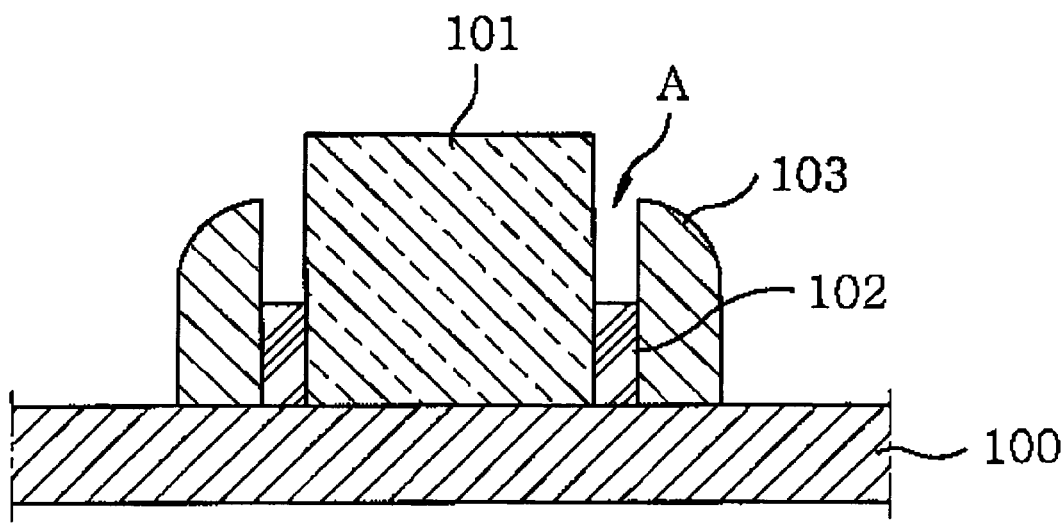
Figure 1D:
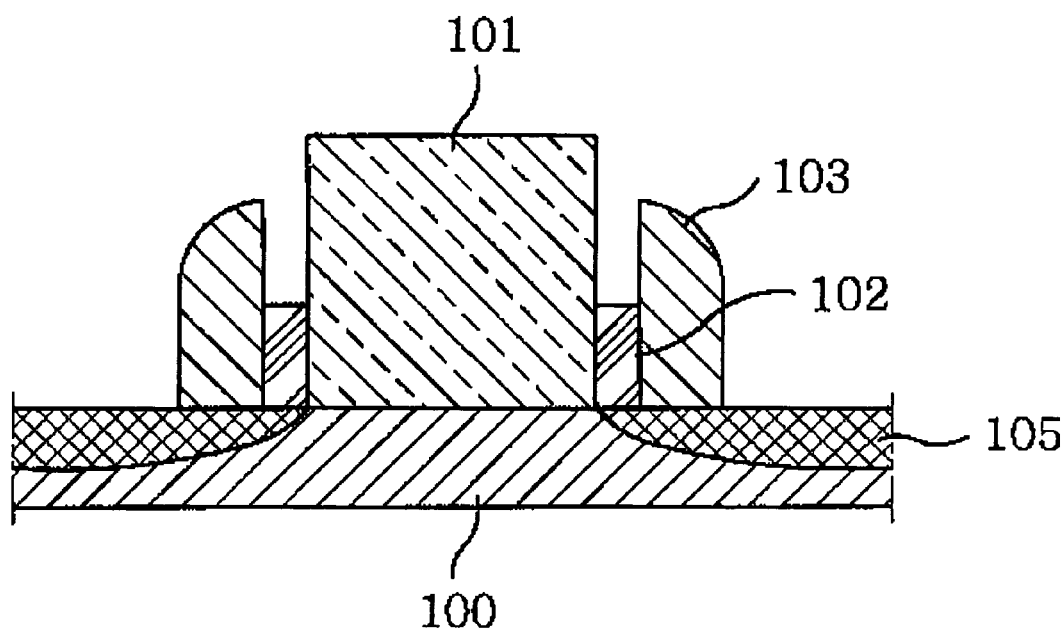
Figure 1E:
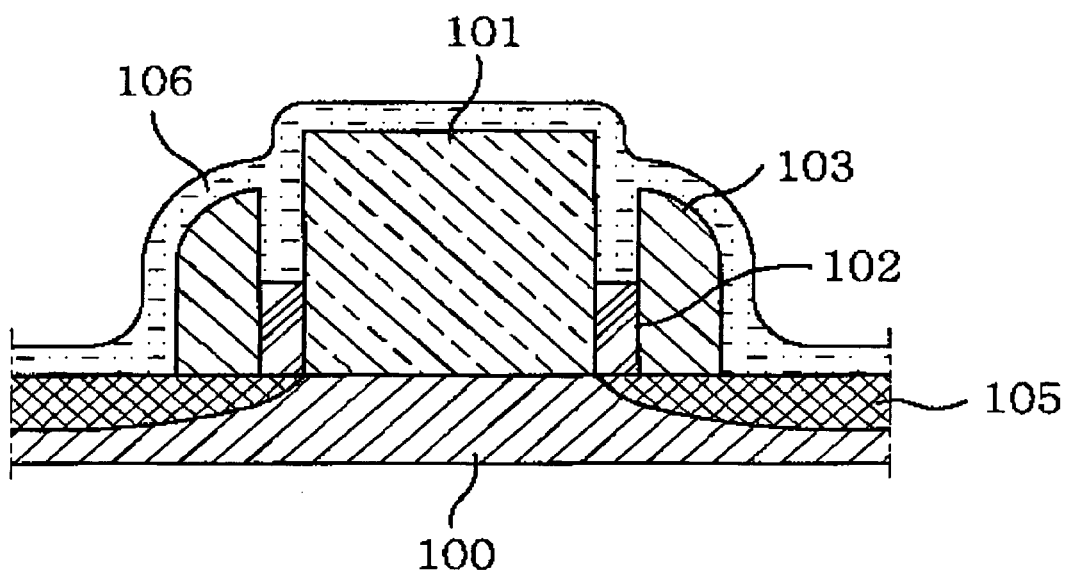
Figure 1F:
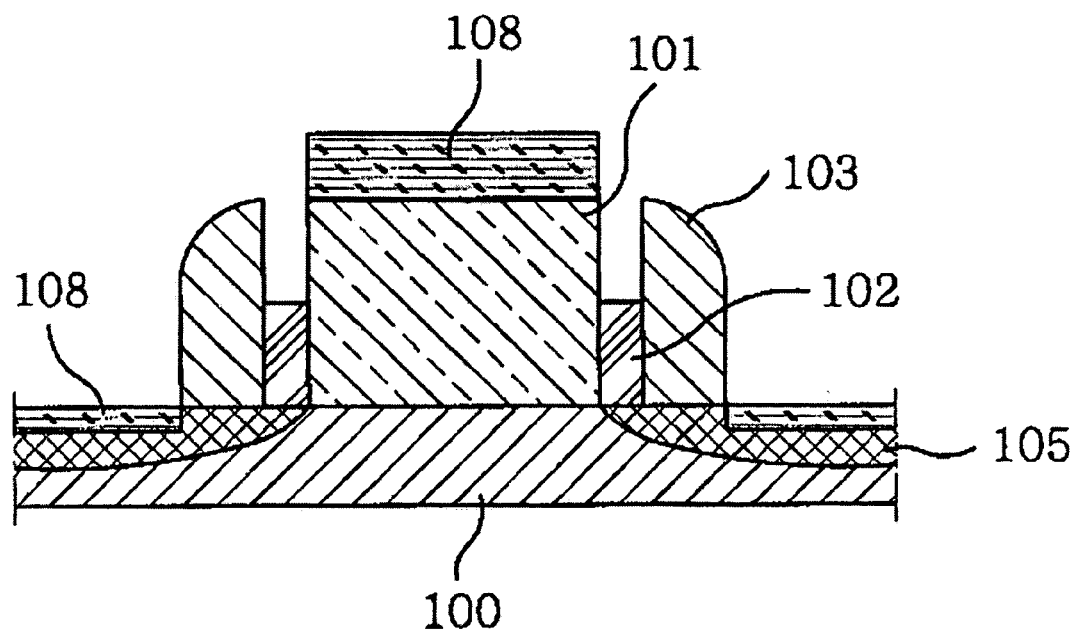
Figure 2A:
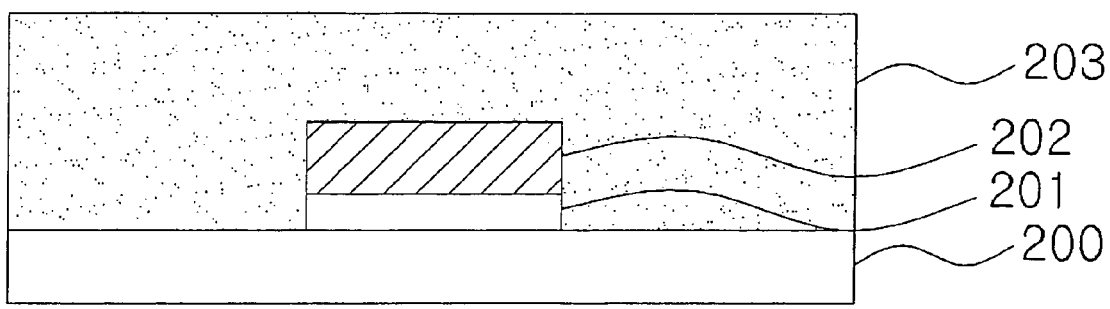
FIG. 2a through FIG. 2d are cross-sectional views illustrating an example method for fabricating a silicide of a semiconductor device performed in accordance with the teachings of the present invention.

Referring to FIG. 2a, a gate oxide layer 201, a gate electrode 202 and an insulating layer 203 are deposited on the top surface of a substrate 200. More specifically, the gate oxide layer 201 is deposited on the top surface of a substrate 200. A gate electrode material is deposited on the gate oxide layer 201. The gate electrode 202 is then formed by etching a predetermined portion of the gate oxide layer 201 and the gate electrode material using a well known photolithography process. An insulating layer 203 is then deposited on the resulting structure including on the gate electrode 202. The gate electrode material preferably comprises poly-silicon. The insulating layer 203 preferably comprises an oxide material.

Figure 2B:
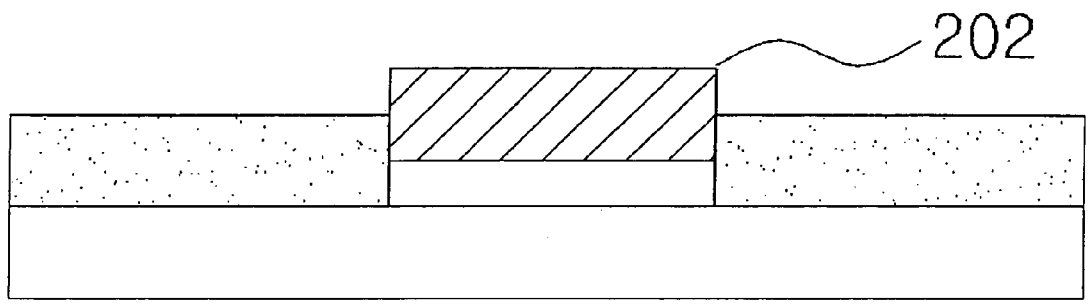

Referring to FIG. 2b, a predetermined portion of the insulating layer 203 is removed. The insulating layer 203 is removed to expose a predetermined portion of the top and sides of the gate electrode 202. The removal of the insulating layer 203 is completed by etching the entire area without an etching mask or a CMP process.

Figure 2C:
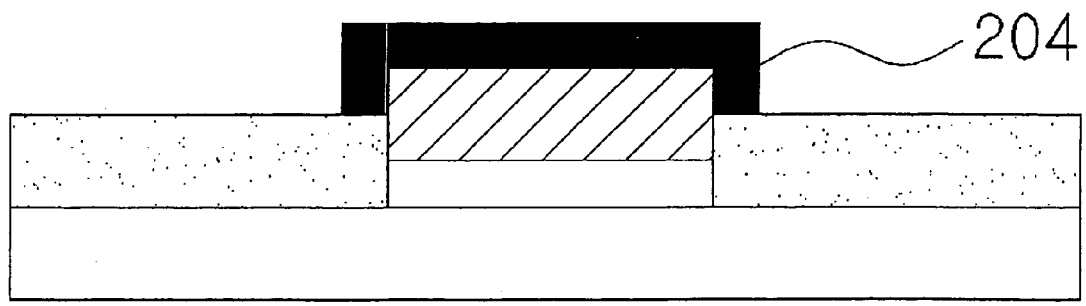

Referring to FIG. 2c, a silicide 204 is formed on the gate electrode 202. In particular, a silicide formation material is deposited on the structure including the gate electrode 202. An annealing process is then performed. The silicide 204 is then formed by a reaction between the gate electrode 202 and the silicide formation material. Unreacted silicide formation material is then removed to complete the silicide formation process. The silicide formation material preferably comprises a material selected from transition elements such as tungsten, titanium, tantalum, cobalt, hafnium or an alloy of any of tungsten, titanium, tantalum, cobalt, or hafnium.

Figure 2D:
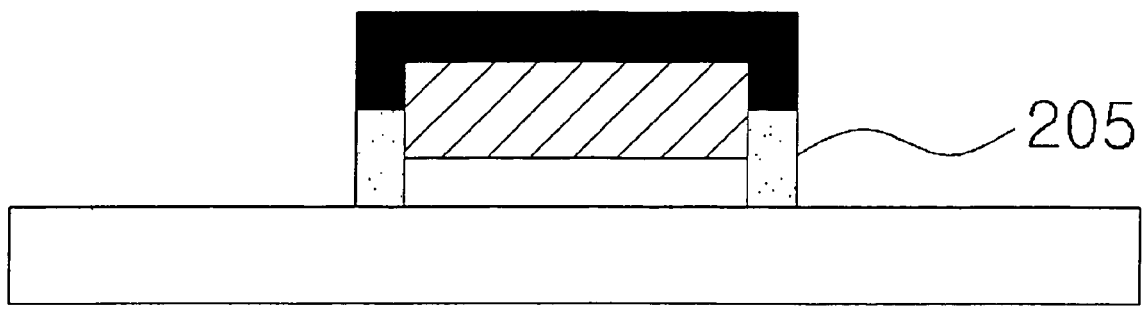

Referring to FIG. 2d, spacers 205 are formed by etching the insulating layer 203 while using the silicide 204 as an etching mask. The insulating layer 203 under the silicide 204 survives the etching process to become spacers 205 which protect the sidewalls of the gate electrode 202. As shown in FIG. 2d, spacers 205 can be formed lower than the gate electrode. A process for implanting ions may then be performed to form a transistor having an LDD (Lightly Doped Drain) structure as in conventional methods.

Accordingly, a silicide 204 is formed on exposed top and side portions of a gate electrode 202. The silicide 204 functions as an etching mask to form sidewalls 205 so that a stable silicide 204 is formed regardless of the diminution of the size of the gate electrode 202. Moreover, the oxide layer 201 in an active region is protected from over-etching. Thus, a highly reliable semiconductor device is fabricated.

From the foregoing, persons of ordinary skill in the art will appreciate that methods for fabricating a silicide 204 of a semiconductor device have been disclosed. The illustrated methods fabricate a stable silicide 204 on a gate electrode 202 regardless of the diminution of the gate size.

An illustrated method for fabricating a silicide 204 of a semiconductor device comprises forming a gate electrode 202, depositing an insulating layer 203, removing a predetermined portion of the insulating layer 203 in order to expose the gate electrode 202, forming silicide 204 on the exposed gate electrode 202 and etching the insulating layer 203 with the silicide 204 as an etching mask.

It is noted that this patent claims priority from Korean Patent Application Serial Number 10-2003-0066135, which was filed on Sep. 24, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method to fabricate a silicide of a semiconductor device comprising:
   forming a gate electrode;
   depositing an insulating layer on the gate electrode;
   removing a predetermined portion of the insulating layer in order to expose a top surface and a portion of the sidewalls of the gate electrode;
   forming silicide on the exposed top surface and portion of the sidewalls of the gate electrode; and
   etching the insulating layer while using the silicide as an etching mask.

2. The method as defined by claim 1, wherein the insulating layer comprises an oxide material.

3. The method as defined by claim 1, wherein the predetermined portion of the insulating layer is removed by performing a CMP process.

4. The method as defined by claim 1, wherein the predetermined portion of the insulating layer is removed by etching without using an etching mask.

5. The method as defined by claim 1, wherein forming a silicide comprises: depositing a silicide formation material on the gate electrode; forming silicide through an annealing process; and removing unreacted silicide material.

6. The method as defined by claim 5, wherein the silicide formation material comprises a material selected from transition elements or an alloy of transition elements.

7. The method as defined by claim 5, wherein the silicide formation material comprises a material selected from the group comprising: tungsten, titanium, tantalum, cobalt, nickel and hafnium.

8. The method as defined by claim 1, wherein etching the insulating layer forms at least one spacer under the silicide and on the sidewall of the gate electrode.

9. The method as defined by claim 8, wherein the spacer is formed lower than the gate electrode.

* * * * *